US008640007B1

(12) United States Patent  
Schulze

(10) Patent No.: US 8,640,007 B1  
(45) Date of Patent: Jan. 28, 2014

(54) METHOD AND APPARATUS FOR TRANSMITTING DIAGNOSTIC DATA FOR A STORAGE DEVICE

(75) Inventor: Martin E. Schulze, Longmont, CO (US)

(73) Assignee: Western Digital Technologies, Inc., Irvine, CA (US)

( * ) Notice: Subject to any disclaimer, the term of this patent is extended or adjusted under 35 U.S.C. 154(b) by 278 days.

(21) Appl. No.: 13/249,193

(22) Filed: Sep. 29, 2011

(51) Int. Cl.  
*G11C 29/00* (2006.01)

(52) U.S. Cl.  
USPC ............................................ 714/769; 714/30

(58) Field of Classification Search  
USPC ............ 700/94; 709/224; 370/429; 715/764; 714/733, 718, 769, 30  
See application file for complete search history.

(56) References Cited

U.S. PATENT DOCUMENTS

| | | | |
|---|---|---|---|
| 6,321,329 B1 | 11/2001 | Jaggar et al. | |
| 6,446,221 B1 | 9/2002 | Jaggar et al. | |
| 6,567,933 B1 | 5/2003 | Swoboda et al. | |
| 6,735,650 B1 | 5/2004 | Rothberg | |
| 6,857,084 B1 | 2/2005 | Giles | |
| 6,895,455 B1 | 5/2005 | Rothberg | |
| 7,039,831 B2 | 5/2006 | Phillips | |
| 7,130,932 B1 | 10/2006 | Ghaffari | |
| 7,200,698 B1 | 4/2007 | Rothberg | |
| 7,404,013 B1 | 7/2008 | Masiewicz | |
| 7,506,205 B2 | 3/2009 | Pedersen et al. | |
| 7,571,269 B2 | 8/2009 | Schmidt et al. | |
| 7,673,075 B1 | 3/2010 | Masiewicz | |
| 7,827,320 B1 | 11/2010 | Stevens | |
| 8,145,332 B2 * | 3/2012 | Sutardja et al. | 700/94 |
| 2002/0165952 A1 * | 11/2002 | Sewell et al. | 709/224 |
| 2003/0037225 A1 | 2/2003 | Deng et al. | |
| 2003/0120968 A1 | 6/2003 | Andress et al. | |
| 2003/0131125 A1 | 7/2003 | Ooi | |
| 2003/0221061 A1 | 11/2003 | El-Batal et al. | |
| 2003/0236952 A1 | 12/2003 | Grieff et al. | |
| 2003/0236953 A1 | 12/2003 | Grieff et al. | |
| 2004/0019718 A1 | 1/2004 | Schauer et al. | |
| 2005/0086413 A1 | 4/2005 | Lee et al. | |
| 2005/0149892 A1 | 7/2005 | Yee | |
| 2007/0214389 A1 | 9/2007 | Severson et al. | |
| 2008/0075103 A1 * | 3/2008 | Noble et al. | 370/429 |
| 2009/0055637 A1 | 2/2009 | Holm et al. | |
| 2010/0011250 A1 | 1/2010 | Pedersen | |
| 2010/0174892 A1 | 7/2010 | Steeb | |
| 2011/0078596 A1 * | 3/2011 | Rawlins et al. | 715/764 |

OTHER PUBLICATIONS

John Masiewicz, "AT Attachment with Packet Interface—7 vol. 3—Serial Transport Protocols and Physical Interconnect", Working Draft American National Standard for Information Technology, T13 Project 1532D, Revision 4b, Apr. 21, 2004, pp. i-282.  
Robert C. Elliott, "Serial Attached SCSI (SAS)", Working Draft American National Standard for Information Technology, Project T10/1562-D, Revision 5, Jul. 9, 2003, pp. i-432.  
American National Standard for Information Technology, AT Attachment with Packet Interface—7 vol. 3 Serial Transport Protocols and Physical Interconnect (ATAIATAPI-7 V3), Apr. 21, 2004, pp. 19, 23, 35, 59-60, 121-122, 126-127, 132.

* cited by examiner

*Primary Examiner* — David Ton

(57) ABSTRACT

A test system including a storage device and a protocol analyzer coupled to the storage device. The storage device can include a diagnostic data transmission unit configured to transmit diagnostic data related to an operation of the storage device, and a host interface unit including a first selector configured to receive idle characters and the diagnostic data, wherein the first selector selectively transmits the idle characters or the diagnostic data. The protocol analyzer can be configured to autonomously receive the idle characters or the diagnostic data via the host interface unit.

33 Claims, 5 Drawing Sheets

METHOD AND APPARATUS FOR TRANSMITTING DIAGNOSTIC DATA FOR A STORAGE DEVICE

BACKGROUND

A storage device is commonly used to store data in computers, databases, digital video recorders, and other devices. The storage device may write data to and read data from a storage unit in response to write/read commands from a host that uses the storage unit for data storage. However, the storage device may encounter operational issues during its normal operation that requires diagnosis. Thus, to diagnose the operational issues, the storage device may have test pins which are dedicated to transferring information regarding the operation of the storage device to a debugging device. However, manufacturing storage devices with the dedicated test pins can be expensive. For example, the test pins may require additional design considerations and also may take up critical space in the storage device.

Furthermore, the test pins may be located in an inconvenient location which is difficult to access for a user. Thus, it may be difficult for users to access information regarding the operation of the storage device using the test pins.

BRIEF DESCRIPTION OF THE DRAWINGS

The features and advantages of the present embodiments of the present invention will become more apparent from the detailed description set forth below when taken in conjunction with the drawings, wherein.

DETAILED DESCRIPTION

Figure 1:
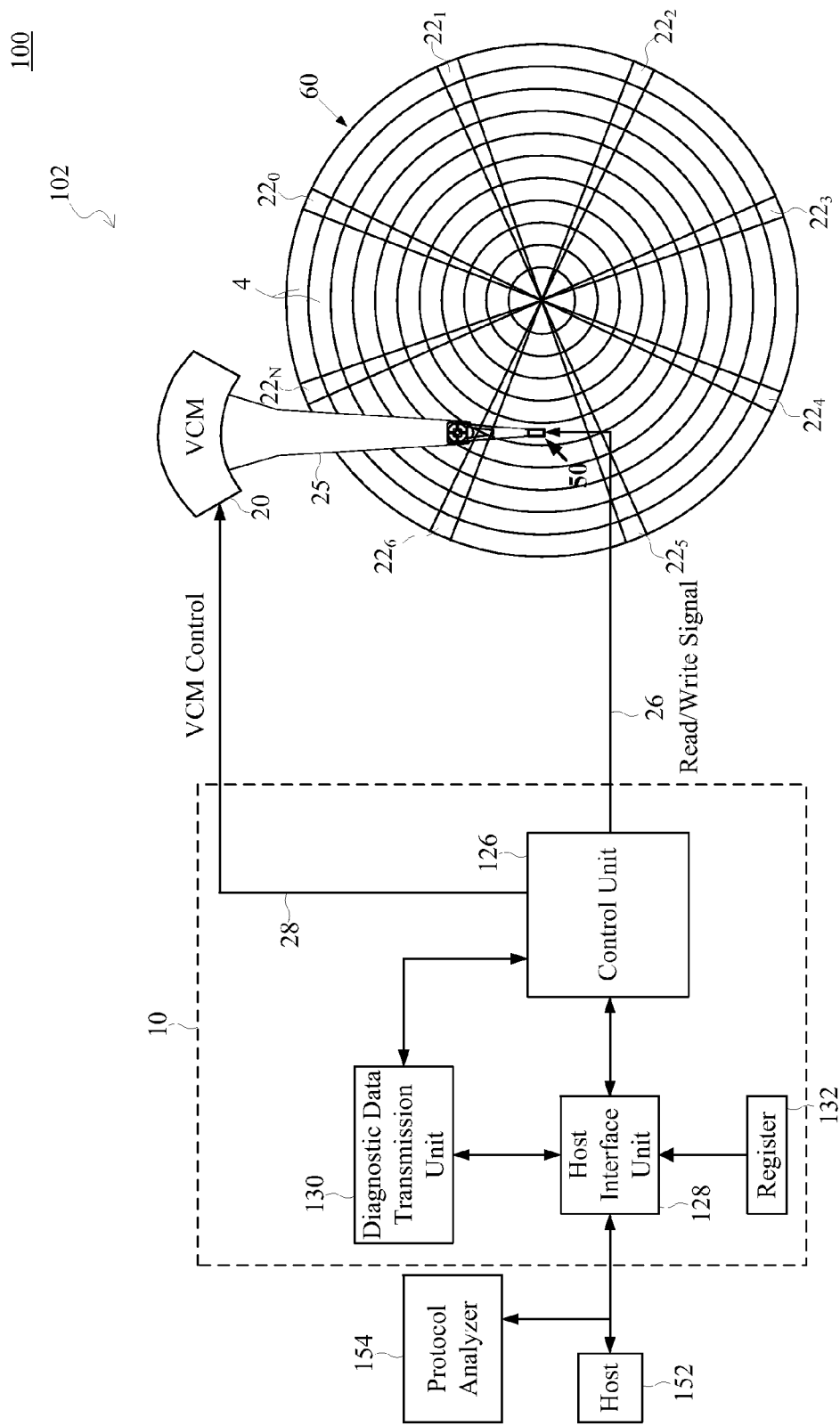
FIG. 1 depicts a test system including a storage device having a disk, a host, and a protocol analyzer according to an embodiment of the present invention.

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

In an embodiment of the present invention, a test system 100 includes a storage device 102, a host 152, and a protocol analyzer 154. The storage device 102 can transmit data to the host 152. The data can also be transmitted to the protocol analyzer 154, which will be described in more detail later. In an embodiment, the host 152 and the protocol analyzer 154 can be coupled to the storage device 102. In an embodiment, the protocol analyzer does not transmit data to the storage device 102, but can receive data from the storage device 102.

The storage device 102 can include, for example, a voice coil motor (VCM) 20, head 50, an actuator arm 25, a disk 60, and a controller 10. The head 50 is connected to the distal end of an actuator arm 25. The actuator arm 25 is rotated about a pivot by the voice coil motor VCM 20 to position the head 50 radially over the disk 60. In an embodiment, the storage device 102 includes a spindle motor (not shown) for rotating the disk during read/write operations.

The disk 60 comprises a number of radially spaced, concentric tracks 4. Each track 4 may be divided into a number of sectors that are spaced circumferentially along the track 4. The sectors may be used to store user data and/or other information. The disk 60 may also comprise a plurality of angularly spaced servo wedges $22_0$-$22_N$, each of which may include embedded servo information that can be read from the disk 60 by the head 50 to determine the position of the head 50 over the disk 60. For example, each servo wedge $22_0$-$22_N$ may include a pattern of alternating magnetic transitions (servo burst), which may be read from the disk 60 by the head 50 and processed by the controller 10 to estimate the position of the head 50 relative to the disk 60. The angular spacing between the servo wedges $22_0$-$22_N$ may be uniform, as shown in the example in FIG. 1.

The controller 10 can include a host interface unit 128, a diagnostic data transmission unit 130, and a control unit 126. The control unit 126 can estimate the position of the head 50 relative to the disk 60 using the servo weds $22_0$-$22_N$. The controller 10 may be implemented using one or more processors for executing instructions and may further include memory, such as a volatile or non-volatile memory, for storing data (e.g., data being processed) and/or instructions. The instructions may be executed by the one or more processors to perform the various functions of the controller 10 described herein. The one or more processors may include a microcontroller, a Digital Signal Processor (DSP), an Application Specific Integrated Circuit (ASIC), a Field Programmable Gate Array (FPGA), hard-wired logic, analog circuitry and/or a combination thereof.

Figure 2:
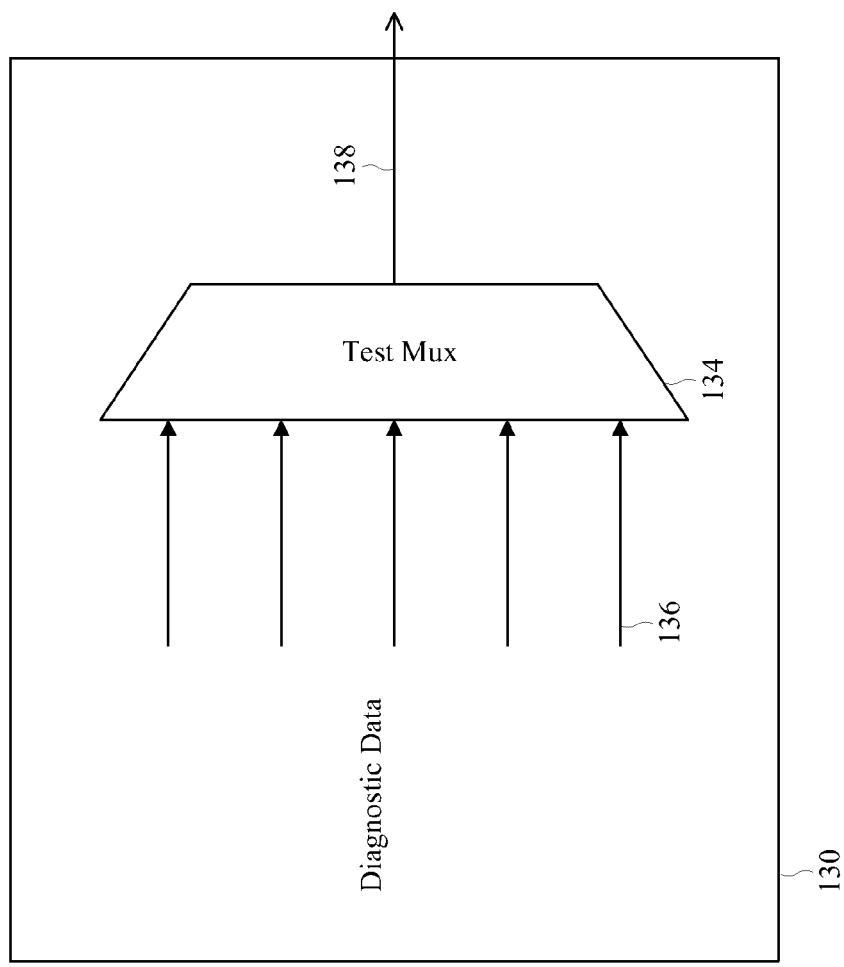
FIG. 2 depicts a diagnostic data transmission unit according to an embodiment of the present invention.

In an embodiment as seen in FIG. 2, the diagnostic data transmission unit 130 of the controller 10 includes a multiplexer 134. The multiplexer 134 receives a plurality of diagnostic data 136 and selectively transmits the selected diagnostic data 138 from the plurality of diagnostic data 136. The diagnostic data 136 can be, for example, debugging information related to an operation of the storage device 102. In an embodiment, the diagnostic data 136 includes information from hardware state machines, information from processors, or other information relevant to the operation of the storage device 102. The information from the processors can include, for example, operational data from the processors.

Figure 3:
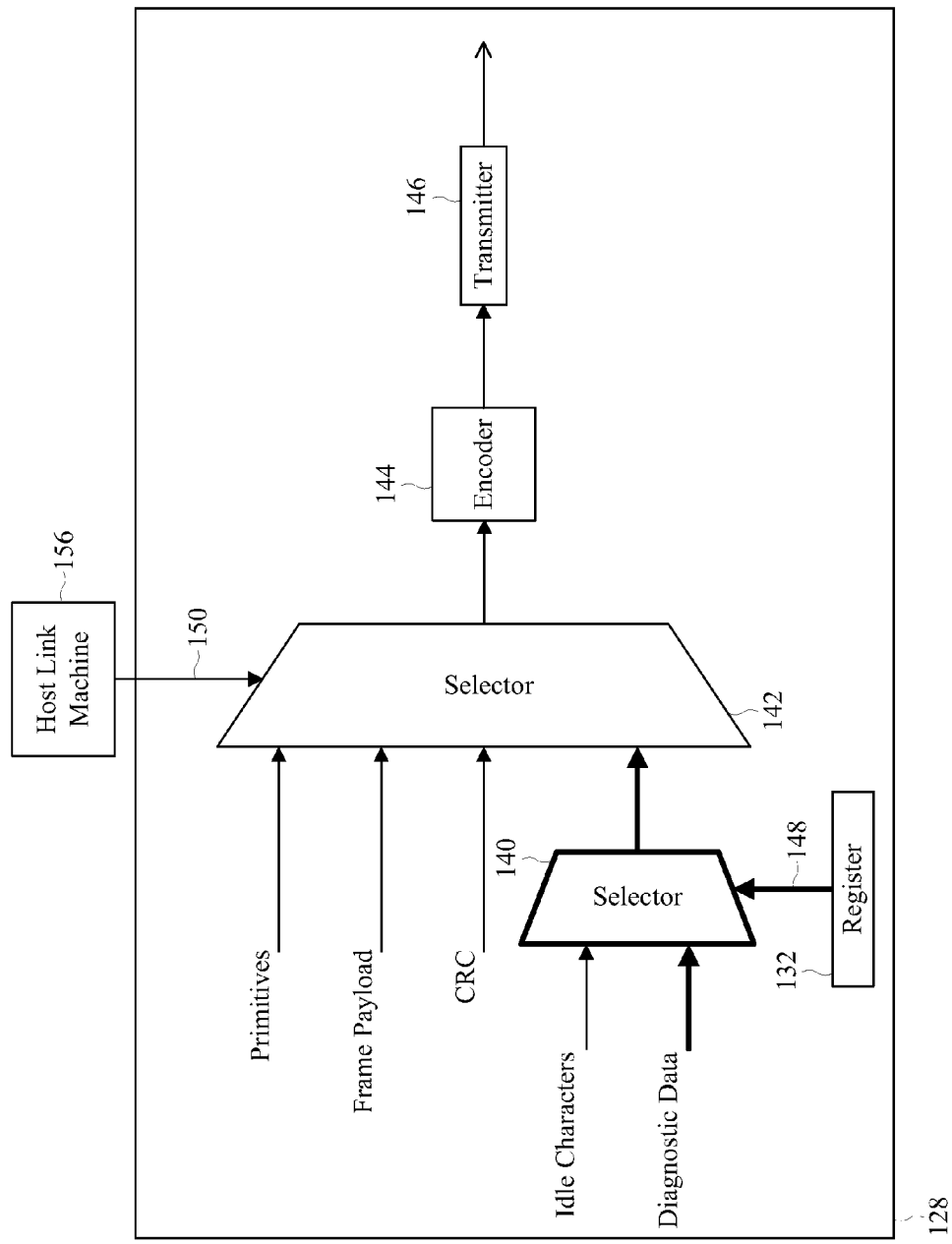
FIG. 3 depicts a host interface unit including multiple selectors, a register, an encoder, and a transmitter, according to an embodiment of the present invention.

In an embodiment as seen in FIG. 3, the host interface unit 128 of the controller 10 receives the diagnostic data from the multiplexer 134 in the data transmission unit 130 (FIG. 2). In an embodiment, the host interface unit 128 is a serial interface. For example, the host interface unit 128 can be a serial advanced technology attachment ("SATA") interface, or a serial attached small computer system interface ("SAS").

The host interface unit 128 can include, for example, a first selector 140, a second selector 142, a register 132, an encoder 144, and a transmitter 146. The first selector 140 receives the diagnostic data from the multiplexer 134 in the data transmission unit 130 (FIG. 2), and also idle characters. The first selector 140 selectively transmits the diagnostic data or the idle characters based on a signal 148 from the register 132.

The signal 148 depends on a status of the register 132. In one embodiment, the status of the register 132 can be manipulated, for example, by a processor in the controller 10. In an embodiment, the host 152 is configured to control the processor to manipulate the register 132.

The second selector 142 receives the idle characters or the diagnostic data from the first selector 140 and transmits either interface data, or the output of the first selector 140 based on a signal 150 from a host link machine 156 configured to control an output of the second selector 142. In an embodiment, the interface data includes primitives, payload data (frame payload), and cyclic redundancy check ("CRC") data. In one embodiment, the second selector 142 can transmit the output of the first selector 140 when there is substantially no interface data to transmit. In an embodiment, the second selector 142 transmits the output of the first selector 140 when the second selector 142 would normally transmit idle characters. In an embodiment, the idle characters are characters that are transmitted while the host interface unit 128 is active and there is no other information to transmit to the host 152. In an embodiment, the host link machine 156 is a SATA link machine. In another embodiment, the host link machine 156 is a SAS link machine.

Figure 4:
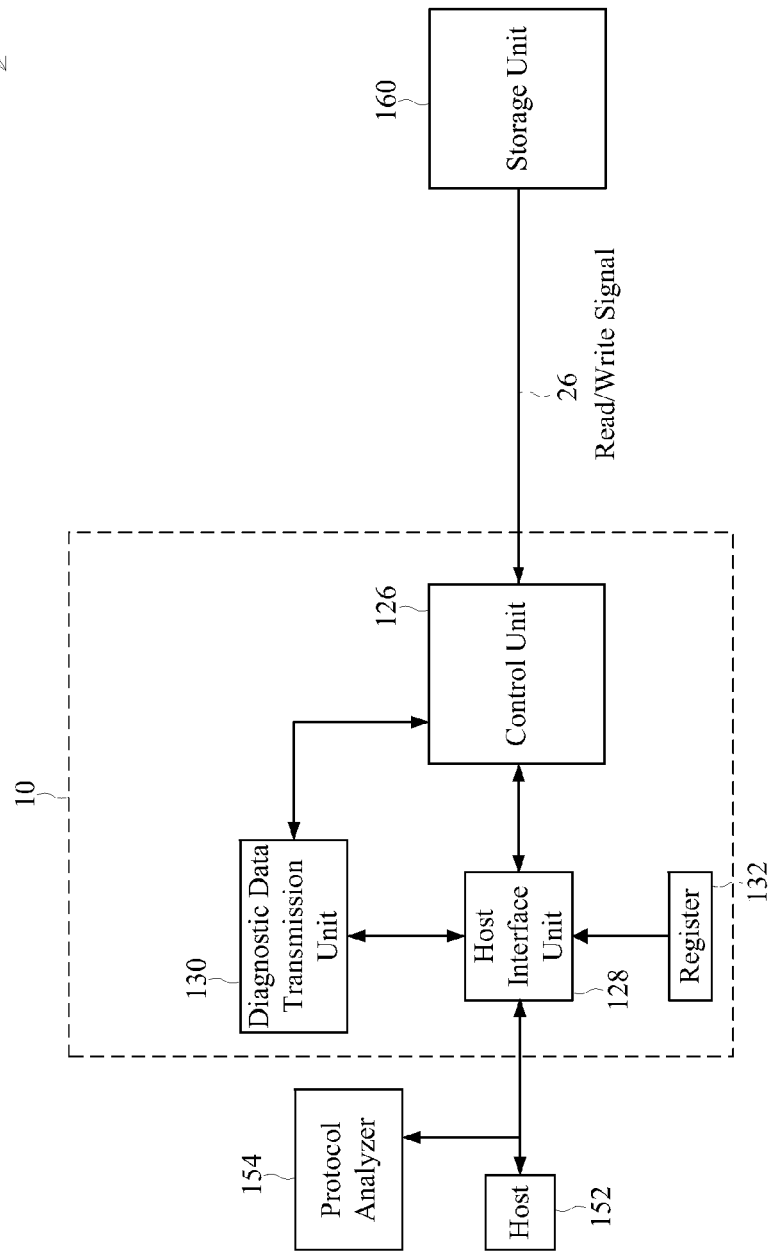
FIG. 4 depicts a test system including a storage device having a storage unit, a host, and a protocol analyzer according to an embodiment of the present invention.

An encoder 144 encodes the output of the second selector 142 while the transmitter 146 transmits the encoded output to the host 152 and the protocol analyzer 154 (FIGS. 1 and 4). In an embodiment, the encoder 144 is an 8b/10b encoder. The protocol analyzer can autonomously receive the encoded output from the transmitter 146. In an embodiment, the protocol analyzer does not need to be modified to receive the encoded output from the transmitter 146. In an embodiment, the protocol analyzer 154 analyzes the diagnostic data in the encoded output to capture and/or display relevant information regarding the operation of the disk drive 102.

In an embodiment, the present invention is a test system 200 shown in FIG. 4. The test system 200 includes the storage device 202 which is similar to the storage device 102 except that the storage device 202 includes a storage unit 160 instead of the disk 60. The storage unit 160 can optionally include the disk 60, but can also include other types of storage media such as non-volatile memory, solid state devices, volatile memory, or any other media which can store data.

Figure 5:
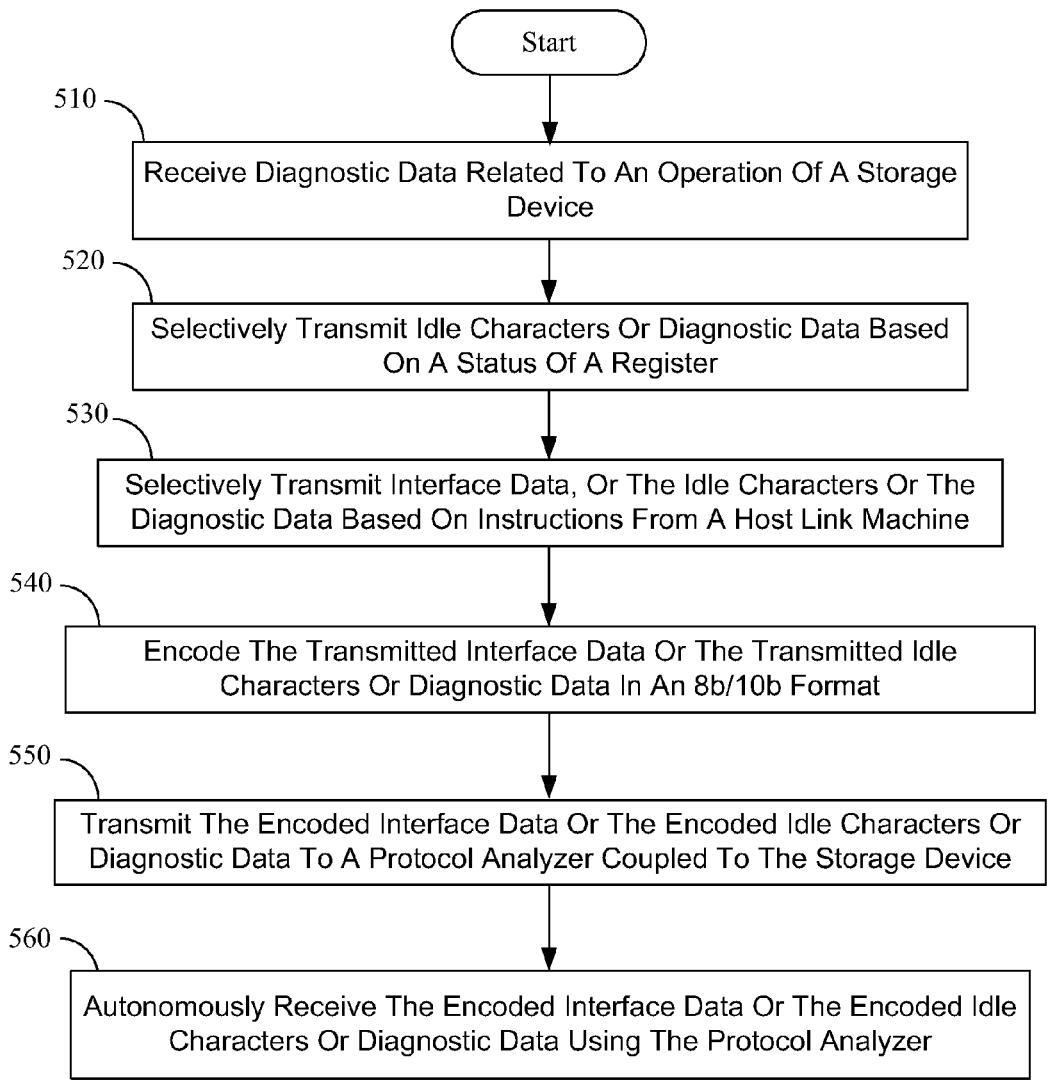
FIG. 5 depicts a process according to an embodiment of the present invention.

In an embodiment, the present invention includes a process as shown in FIG. 5. In Step 510, diagnostic data related to an operation of a storage device is received. For example, the host interface unit 128 can receive diagnostic data related to an operation of the storage device 102 (FIG. 1). Alternatively, the host interface unit 128 can receive diagnostic data related to an operation of the storage device 202 (FIG. 4).

In Step 520, idle characters or diagnostic data are selectively transmitted based on a status of a register. For example, the first selector 140 can selectively transmit idle characters or diagnostic data based on the signal 148 from the register 132 (FIG. 3). For example, the register 132 can be manipulated by the processor in the controller 10. In an embodiment, the host 152 controls the processor to manipulate the register 132.

In Step 530, interface data, or the idle characters or the diagnostic data are selectively transmitted based on instructions from a host link machine. For example, the second selector 142 can selectively transmit the interface data or the output of the first selector 140, the idle characters or the diagnostic data, based on the signal 150 from the host link machine 156.

In Step 540, the transmitted interface data or the transmitted idle characters or diagnostic data are encoded in an 8b/10b format. For example, the encoder 144 can encode the transmitted interface data, or the transmitted idle characters or diagnostic data in an 8b/10b format.

In Step 550, the encoded interface data or the encoded idle characters or diagnostic data are transmitted to a protocol analyzer coupled to the storage device. For example, the transmitter 146 transmits the encoded interface data or the encoded idle characters or diagnostic data to the protocol analyzer 154 coupled to the storage device 102 (FIG. 1) or the storage device 202 (FIG. 4).

In Step 560, the encoded interface data or the encoded idle characters or diagnostic data are autonomously received at the protocol analyzer. For example, the encoded interface data or the encoded idle characters or diagnostic data are autonomously received at the protocol analyzer 154.

Those of ordinary skill would appreciate that the various illustrative logical blocks, modules, and algorithm steps described in connection with the examples disclosed herein may be implemented as electronic hardware, computer software, or combinations of both. Furthermore, the present invention can also be embodied on a machine readable medium causing a processor or computer to perform or execute certain functions.

To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, units, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A test system comprising:
    a storage device including:
        a diagnostic data transmission unit configured to transmit diagnostic data related to an operation of the storage device, and
        a host interface unit including a first selector configured to receive idle characters and the diagnostic data, wherein the first selector selectively transmits the idle characters or the diagnostic data; and
    a protocol analyzer coupled to the storage device and configured to autonomously receive the idle characters or the diagnostic data via the host interface unit.

2. The test system of claim 1 wherein the diagnostic data includes debugging information related to the operation of the storage device.

3. The test system of claim 1 wherein the storage device further includes a processor configured to operate the storage device, wherein the diagnostic data includes operational data from the processor.

4. The test system of claim 3 wherein the storage device further includes a register, wherein the first selector is further configured to selectively transmit the idle characters or the diagnostic data based on a status of the register.

5. The test system of claim 4 further comprising a host coupled to the storage device, wherein the host is further configured to control the processor to manipulate the register.

6. The test system of claim 1 wherein the host interface unit further includes a second selector coupled to the first selector and configured to selectively transmit interface data, or the idle characters or the diagnostic data.

7. The test system of claim 6 wherein the storage device further includes a host link machine, and the second selector is configured to selectively transmit the interface data, or the idle characters or the diagnostic data based on instructions from the host link machine.

8. The test system of claim 7 wherein the host link machine is a serial advanced technology attachment link machine.

9. The test system of claim 7 wherein the host link machine is a serial attached small computer system interface link machine.

10. The test system of claim 6 wherein the host interface unit further includes:
    an encoder configured to receive and encode an output from the second selector; and
    a transmitter configured to transmit the encoded output from the second selector to the protocol analyzer.

11. The test system of claim 10 wherein the encoder is an 8b/10b encoder.

12. The test system of claim 1 wherein the host interface unit is a serial interface.

13. The test system of claim 12 wherein the host interface unit is a serial advanced technology attachment interface.

14. The test system of claim 12 wherein the host interface unit is a serial attached small computer system interface.

15. The test system of claim 1 wherein the storage device further includes a storage media, wherein the storage media includes a disk.

16. The test system of claim 1 wherein the storage device further includes a storage media, wherein the storage media includes a non-volatile memory.

17. A method for testing a storage device having a storage media comprising:
    receiving diagnostic data related to an operation of a storage device;
    transmitting idle characters or the diagnostic data; and
    autonomously receiving the idle characters or the diagnostic data using a protocol analyzer coupled to the storage device.

18. The method of claim 17 wherein the diagnostic data includes debugging information related to the operation of the storage device.

19. The method of claim 17 wherein the diagnostic data includes operational data from a processor configured to operate the storage device.

20. The method of claim 19 wherein the step of transmitting the idle characters or the diagnostic data includes transmitting the idle characters or the diagnostic data based on a status of a register.

21. The method of claim 20 further comprising controlling the processor using a host coupled to storage device, to manipulate the status of the register.

22. The method of claim 17 further comprising selectively transmitting interface data, or the idle characters or the diagnostic data.

23. The method of claim 22 wherein the step of selectively transmitting the interface data, or the idle characters or the diagnostic data includes selectively transmitting the interface data, or the idle characters or the diagnostic data based on instructions from a host link machine.

24. The method of claim 23 further comprising
    encoding the selectively transmitted interface data, or the transmitted idle characters or diagnostic data; and
    transmitting the encoded selectively transmitted interface data, or the encoded idle characters or diagnostic data to the protocol analyzer.

25. The method of claim 24 wherein the step of encoding the selectively transmitted interface data, or the transmitted idle characters or diagnostic data includes encoding the selectively transmitted interface data, or the transmitted idle characters or diagnostic data using an 8b/10b encoder.

26. The method of claim 23 wherein the host link machine is a serial advanced technology attachment link machine.

27. The method of claim 23 wherein the host link machine is a serial attached small computer system interface link machine.

28. The method of claim 17 wherein the step of transmitting the idle characters or the diagnostic data, includes transmitting the idle characters or the diagnostic data using a host interface unit.

29. The method of claim 28 wherein the host interface unit is a serial interface.

30. The method of claim 29 wherein the host interface unit is a serial advanced technology attachment interface.

31. The method of claim 29 wherein the host interface unit is a serial attached small computer system interface.

32. The method of claim 17 wherein the storage device further includes a storage media, and wherein the storage media includes a disk.

33. The method of claim 17 wherein the storage device further includes a storage media, and wherein the storage media includes a non-volatile memory.

* * * * *